United States Patent [19]

Alberts

[11] 4,163,946
[45] Aug. 7, 1979

[54] NOISE-IMMUNE MASTER TIMING GENERATOR

[75] Inventor: Steven L. Alberts, Kent, Wash.

[73] Assignee: GTE Sylvania Incorporated, Stamford, Conn.

[21] Appl. No.: 911,851

[22] Filed: Jun. 2, 1978

[51] Int. Cl.$^2$ .......................................... H03K 1/18
[52] U.S. Cl. ................................... 328/63; 178/69.1; 307/269; 328/110
[58] Field of Search ................ 178/69.1; 179/15 BS; 307/208, 269, 232; 328/63, 72, 155, 109, 110; 235/92 PB, 92 TF, 92 T; 364/200 MS File, 900 MS File

[56] References Cited

U.S. PATENT DOCUMENTS

| | | | |
|---|---|---|---|
| 3,047,841 | 7/1962 | Kondi | 340/167 |
| 3,069,504 | 12/1962 | Kaneko | 179/15 |
| 3,472,961 | 10/1969 | Wheeler et al. | 178/69.5 |
| 3,894,246 | 7/1975 | Torgrim | 307/208 |
| 3,947,634 | 3/1976 | Betts | 178/69.5 DC |

Primary Examiner—Robert L. Griffin
Assistant Examiner—Peter Durigon
Attorney, Agent, or Firm—Peter Xiarhos

[57] ABSTRACT

A noise-immune master timing generator operable to produce timing signals synchronized with external reference signals and to maintain phase synchronization even in a noise environment. First and second gate signals of different time duration are derived from a counter chain of the master timing generator and examined with respect to the time of occurrence of an external reference signal.

If the reference signal is within the first gate signal, as occurs during normal, noise-free conditions, there is no adjustment of the counting chain to resynchronize the counting chain to the reference signal. If the reference signal is outside of the first gate signal but within the second gate signal, representing a minor phase error condition, or if the reference signal is outside of both of the gate signals, representing a more serious error condition, the counter chain is resynchronized only if the next reference signal is also outside of the first gate signal, either outside of the first gate signal but within the second gate signal or outside of both gate signals. Various phase error signals are also produced indicative of the type and extent of phase error conditions.

20 Claims, 8 Drawing Figures

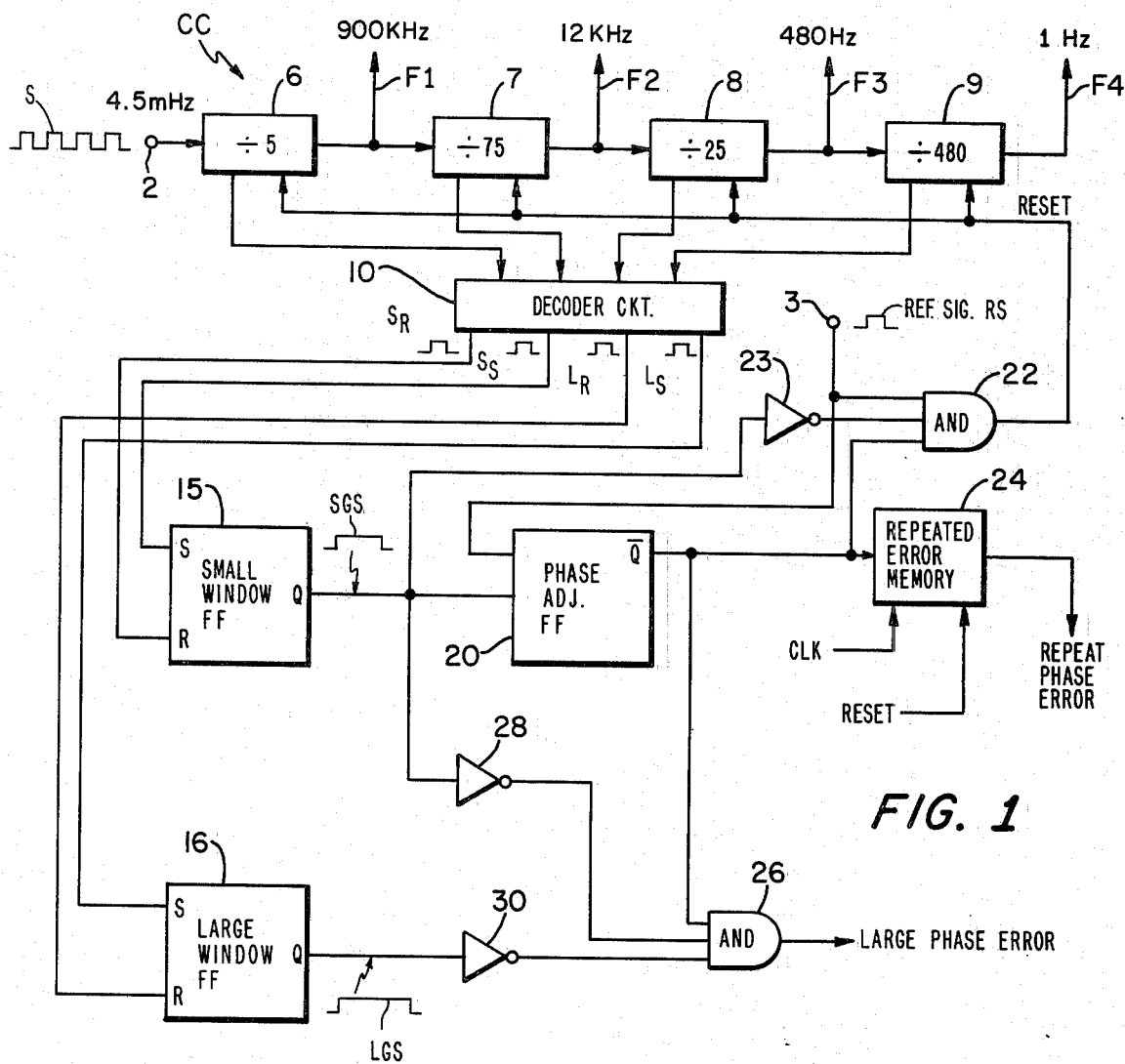
*FIG. 1*
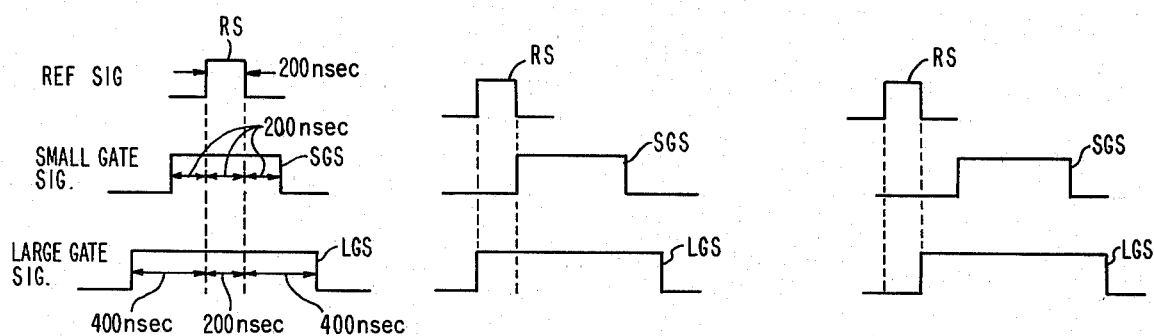
*FIG. 3(a)*   *FIG. 3(b)*   *FIG. 3(c)*

NOISE-IMMUNE MASTER TIMING GENERATOR

The invention herein described was made in the course of a contract with the Department of the Navy.

BACKGROUND OF THE INVENTION

The present invention relates to a master timing generator and, more particularly, to a noise-immune master timing generator operable to produce timing signals synchronized with external reference signals and to maintain phase synchronization even in a noise environment. The noise-immune master timing generator is further operable to produce phase error signals in response to repeated minor phase error conditions or in response to major, more serious, phase error conditions.

In present day communication systems, especially those requiring a large number of precisely-timed operations, it is important that the timing of these operations be properly and correctly executed even in the presence of noise or other similar high-energy disturbances. By way of example, it is common in many digital communication systems to provide a master timing generator from which all timing signals for the system are derived and which are synchronized with an external reference signal to insure that all of the timing signals derived from the master timing generator are in proper, precise timing and phase relationship. If the external reference signal is corrupted by noise or other high-energy disturbances, the master timing generator will attempt to track the erroneous signal, thereby causing timing perturbations within the system and, consequently, causing serious synchronization problems within the system and degradation of the performance of the system. It is important in the above situation therefore that the presence of noise be quickly and readily detected so that the operation of the system can be altered during the presence of the noise or other appropriate measures taken to compensate for the presence of the noise. It may be further desirable in a system as described above to alter the timing of the master timing generator only when the reference signal is phase displaced with respect to the timing signals produced by the master timing generator by more than a predetermined specified minimum, for example, representing a "jitter" condition, thereby to prevent adjustment of the timing of the master timing generator for very minor changes in the timing of the reference signal. It may also be desirable in a system as described above to produce a phase error signal whenever the reference signal is repeatedly phase displaced with respect to the timing signals of the master timing generator by more than the predetermined minimum amount, and also to produce a phase error signal whenever the reference signal is phase displaced with respect to the timing signals of the master timing generator by more than a predetermined maximum, representing a serious phase error condition. These phase error signals may then be conveniently employed by external circuitry as a measure of the extent and frequency of the phase error conditions.

Apparatus commonly employed heretofore for correcting the timing of a master timing generator in a noise environment has generally been of a phase-locked loop type. However, this type of apparatus has a slow response time and is therefore slow to make corrections in the timing of a master timing generator and, in addition, will make slight phase adjustments when the reference signal is present in a noise environment or has very minor variations in timing, such as "jitter". Further, a phase-locked loop circuit does not normally indicate phase error conditions and, accordingly, does not normally provide a measure of the extent and frequency of the phase error conditions.

SUMMARY OF THE INVENTION

In accordance with the present invention a master timing generator is provided which is capable of being synchronized with reference signals in a noise environment and which avoids the problems associated with prior art arrangements as described hereinabove.

The master timing generator in accordance with the invention includes a counting means operable to perform repetitive counting operations and has a reset input by which the counting means may be reset. A first circuit means is coupled to the counting means and operates to derive a plurality of gate signals in succession from the counting means. Each of the gate signals is established to be of a predetermined first duration. The master timing generator further includes an input terminal adapted to receive a plurality of reference signals in succession and corresponding to the plurality of gate signals derived by the first circuit means. Each of the reference signals is of a second duration less than the first duration of a gate signal derived by the first circuit means.

A second circuit means is coupled to the input terminal for receiving each reference signal, to the first circuit means for receiving each gate signal, and to the reset input of the counting means. The second circuit means operates to ascertain the time of occurrence of each reference signal with respect to its corresponding gate signal and if successive ones of the reference signals occur outside of their corresponding gate signals to produce and apply a reset signal to the reset input of the counting means for resetting the counting means.

As a further aspect of the invention, the first circuit means as described above may be further arranged to derive a plurality of second gate signals from the counting means. Each of the second gate signals in this case is established to have a duration greater than the duration of a first gate signal as described hereinabove and each first gate signal is established to be centered within a corresponding second gate signal. The second circuit means receives the second gate signals in addition to the first gate signals and the reference signals and operates to ascertain the time of occurrence of each reference signal with respect to its corresponding first and second gate signals. If a reference signal occurs outside of its corresponding first gate signal but within its corresponding second gate signal or it occurs outside of both gate signals, and the next reference signal also occurs outside of its corresponding first gate signal but within its corresponding second gate signal or outside of both gate signals, the second circuit means operates to produce and apply a reset signal to the reset input of the counting means for resetting the counting means. Further, if a reference signal occurs outside of its corresponding first gate signal but within its corresponding second gate signal or it occurs outside of both gate signals and the next reference signal occurs outside of its corresponding second gate signal, the second circuit means further operates to produce a large phase error output signal.

The master timing generator as described above may further include in accordance with the invention a memory means coupled to the second circuit means and operative to store an indication therein whenever a reference signal occurs outside of its corresponding first gate signal but within its corresponding second gate signal or outside of both gate signals.

BRIEF DESCRIPTION OF THE DRAWING

Various objects, features and advantages of a noise-immune master timing generator in accordance with the present invention will be apparent from the following description taken in conjunction with the accompanying drawing in which:

FIG. 1 is a block diagram of a noise-immune master timing generator in accordance with the present invention;

FIGS. 3(a)–3(c) illustrate typical timing relationships between a reference signal employed by the noise-immune master timing generator for synchronization purposes and gating signals derived from the timing signals produced by the decoder circuit of FIG. 2.

DETAILED DESCRIPTION OF THE INVENTION

Referring now to FIG. 1, there is shown a noise-immune master timing generator 1 in accordance with the present invention. The master timing generator 1 is adapted to receive a digital signal S at an input terminal 2 and to produce a plurality of output timing signals F1–F4 in synchronism with each other and with an external reference signal RS applied to a reference input terminal 3. By way of specific example, the digital signal S may be of a frequency of 4.5 Mhz and be divided down by a counter chain CC comprising series-connected divide-down counters 6, 7, 8 and 9 (by divisor factors of 5, 75, 25 and 480, respectively) to produce timing signals F1, F2, F3 and F4 of 900 Khz, 12 Khz, 480 hz and 1 hz, respectively. The 4.5 Mhz signal may be conveniently derived from a 5 Mhz standard clock signal which is multiplied in a standard multiplier circuit by a factor of 0.9. In a normal, noise-free environment, that is, with the reference signal RS being present in a noise-free environment, the abovementioned output timing signals F1–F4 are synchronized in the apparatus with, and phase locked to, the reference signal RS. However, since it is very unlikely that the reference signal RS will always be free from noise, the reference signal RS itself cannot be used directly to resynchronize the divide-down counters 6, 7, 8 and 9, since, in this case, the counters 6, 7, 8 and 9 would continually adjust erroneously to the noisy reference signal RS. In addition, it is undesirable that the counters 6, 7, 8 and 9 be directly resynchronized to the reference signal RS where the reference signal RS is subject to very minor, yet tolerable, timing variations such as "jitter". Accordingly, before any resynchronization of the counters 6, 7, 8 and 9 is allowed to take place, the time of occurrence of the reference signal RS relative to the output timing signals F1–F4 must first be determined.

Figure 2:
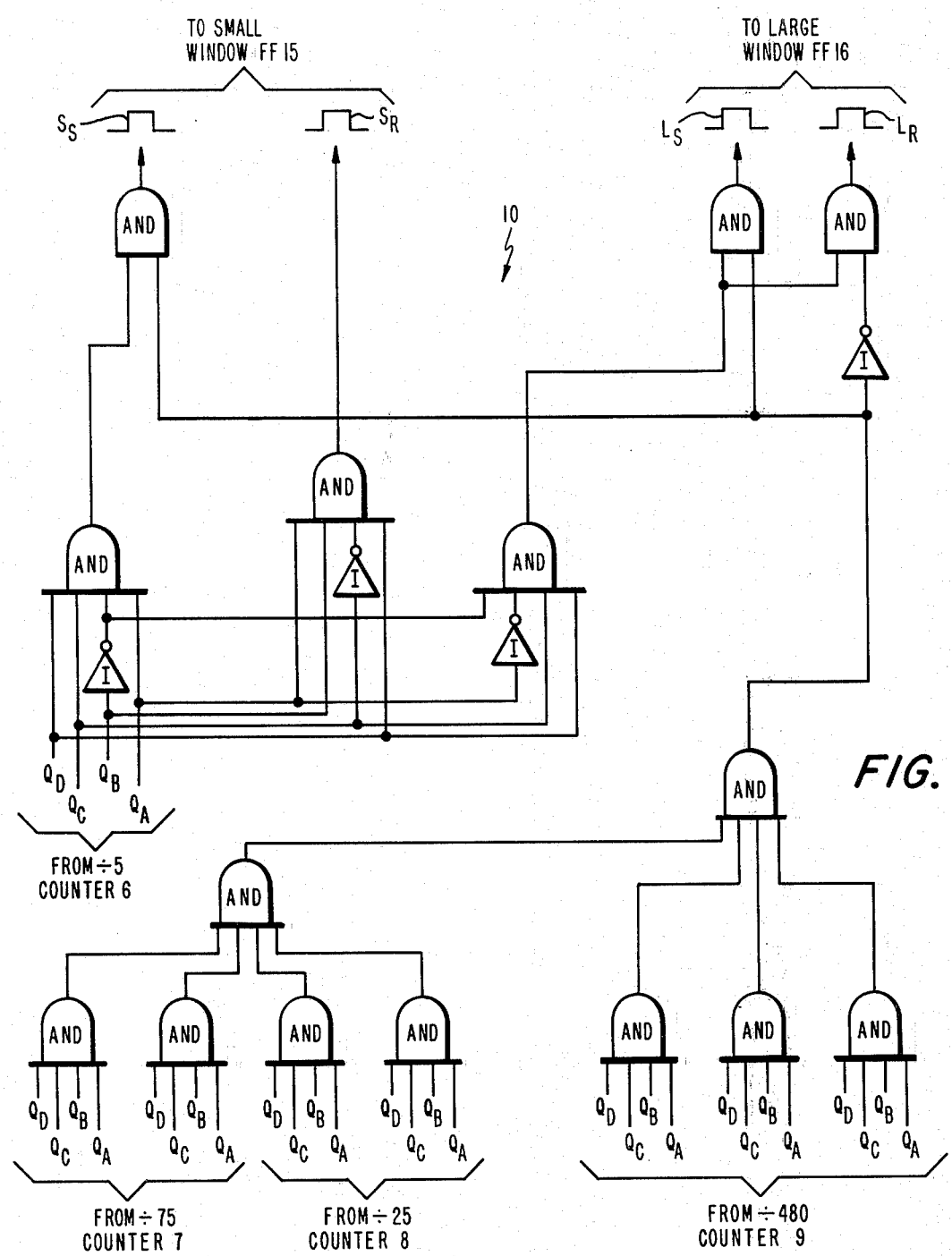
FIG. 2 is a block diagram of an exemplary embodiment of a decoder circuit included in the master timing generator for deriving timing signals for use in detecting phase error conditions.

To determine the time of occurrence of the reference signal RS relative to the output timing signals F1–F4, two pairs of timing signals $S_S$, $S_R$, and $L_S$, $L_R$ are derived by a decoder circuit 10 from the aforementioned divide-down counters 6, 7, 8 and 9 and applied, respectively, to set and reset inputs of a small window flip-flop 15 and of a large window flip-flop 16. Considering the counter chain CC as being capable of counting the 4.5 Mhz signal downwardly from its maximum value to zero, the decoder circuit 10 operates to produce the signal $S_S$ at a time corresponding to one count before the count of zero and to produce the signal $S_R$ at a time corresponding to one count following the count of zero. When the signals $S_S$ and $S_R$ are applied to the small window flip-flop 15, the flip-flop 15 operates to produce a first gate signal SGS (small gate signal) at a Q output thereof having leading and trailing edges corresponding to the signals $S_S$ and $S_R$. In a similar fashion, the decoder circuit 10 operates to produce the signal $L_S$ at a time corresponding to two counts before the count of zero and to produce the signal $L_R$ at a time corresponding to two counts following the count of zero. When the signals $L_S$ and $L_R$ are applied to the large window flip-flop 16, the flip-flop 16 operates to produce a second gate signal LGS (large gate signal) at a Q output thereof having leading and trailing edges corresponding to the signals $L_S$ and $L_R$. With the aforementioned 4.5 Mhz signal at the input terminal 2, the aforementioned divisor factors for the divide-down counters 6, 7, 8 and 9, and the signals $S_S$, $S_R$ and $L_S$, $L_R$ having the timing relationships as described hereinabove, the small gate signal SGS produced by the small window flip-flop 15 has a typical duration of 600 nanoseconds, and the large gate signal SGS produced by the large window flip-flop 16 has a typical duration of 1000 nanoseconds (see FIG. 3(a)). In addition, the small gate signal SGS is centered within the large gate signal LGS. By comparison, the reference signal RS has a typical duration of 200 nanoseconds. Although the decoder circuit 10 may be implemented in several ways, a suitable implementation of the decoder circuit 10 by which the signals $S_S$, $S_R$ and $L_S$, $L_R$ may be derived from the counters 6, 7, 8 and 9, specifically, from sets of stages $Q_A$–$Q_D$ of the counters 6, 7, 8 and 9, is shown in detail in FIG. 2. Standard logic notations are employed in FIG. 2.

Each pair of gate signals SGS and LGS as described hereinabove, representing "windows" of different duration, are examined in accordance with the present invention with respect to the timing of a corresponding reference signal RS to determine whether the reference signal RS is present or absent from within the gate signals SGS and LGS.

In a normal, noise-free environment, the reference signal RS applied to the reference input terminal 3 has a timing relation ship with respect to the small gate signal SGS and the large gate signal LGS as shown in FIG. 3(a). As indicated in FIG. 3(a), the reference signal RS is centered within both the small gate signal SGS and the large gate signal LGS. In accordance with the present invention, so long as the reference signal RS occurs within the small gate signal SGS there is no resynchronization of the counters 6, 7, 8 and 9. Therefore, and as indicated in FIG. 3(a), the reference signal RS is permitted to vary in timing by up to ±200 nanoseconds. These changes are normal and minor and typically represent what is commonly known as "jitter".

The operation of the master timing generator 1 for the normal (noise-free) timing situation as indicated in FIG. 3(a) is as follows. The small gate signal SGS at the Q output of the small window flip-flop 15 is applied to a first input of a phase adjust flip-flop 20 and, on the transition between its low level (e.g., a binary 0 level)

and its high level (e.g., a binary 1 level), causes the flip-flop 20 to operate in its set state and to produce a binary 1 output signal at a Q output thereof. The binary 1 output signal from the Q output of the phase adjust flip-flop 20 is applied to a first input of an AND logic gate 22 and also to an input of a repeated error memory 24. The AND logic gate 22, which also receives a binary 0 signal at a second input thereof as a result of the small gate signal SGS being inverted by an inverter 23, is normally employed to resynchronize the counters 6, 7, 8 and 9 under certain phase error conditions, specifically, phase error conditions in which reference signals RS occur outside of the gate signals SGS and LGS and cause the output of the AND logic gate 22 to be at a binary 1 level. The repeated error memory 24 is normally adapted to store a binary 1 signal from the phase adjust flip-flop 20 each time that a reference signal RS occurs outside of a small gate signal SGS. However, in the present situation as shown in FIG. 3(a), the reference signal RS is within the small gate signal SGS. In this case, after the phase adjust flip-flop 20 has been set on the leading edge of the small gate signal SGS, the reference signal RS, which is applied to a second input of the phase adjust flip-flop 20, causes the phase adjust flip-flop 20 to be reset on its leading edge (binary 0 to binary 1 transition) and the Q output of the flip-flop 20 to change from a binary 1 level to a binary 0 level. The signal at the input of the AND logic gate 22 connected to the Q output of the phase adjust flip-flop 20 accordingly changes from a binary 1 level to a binary 0 level and, since two of the inputs to the AND logic gate 22 are now at a binary 0 level, the output of the AND logic gate 22 is also at a binary 0 level and there is no resynchronization of the counters 6, 7, 8 and 9. In the case of the repeated error memory 24, the input thereto from the Q output of the phase adjust flip-flop 20 similarly changes from a binary 1 level to a binary 0 level with the result that no binary 1 signal is stored therein to indicate that a reference signal RS has occurred outside of the small gate signal SGS. It will be noted that the reference signal RS as discussed herein-above is also applied to a third input of the AND logic gate 22 but since the other inputs of the AND logic gate 22 are already at binary 0 levels as stated hereinabove the reference signal RS has no effect on the AND logic gate 22.

Referring now to FIG. 3(b), there is shown a second possible timing relationship between a reference signal RS and gate signals SGS and LGS as might occur for example in a noise environment. In the specific example shown in FIG. 3(b), the reference signal RS occurs outside of the small gate signal SGS but within the large gate signal LGS. This timing situation represents a minor, yet not tolerable, phase error situation. In this case, it is desired to detect the fact that the reference signal RS is outside of the small gate signal SGS and to record this fact in the memory 24 and, if the next reference signal RS is also outside of its associated small gate signal SGS, to produce a binary 1 signal at the output of the AND logic gate 22 to resynchronize the counters 6, 7, 8 and 9.

The operation of the master timing generator 1 for the specific timing situation shown in FIG. 3(b) is as follows. The small gate signal SGS is applied to the first input of the phase adjust flip-flop 20 and, on its leading edge, causes the flip-flop 20 to be set and to produce a binary 1 output signal at its Q output. This binary 1 output signal is applied to the first input of the AND logic gate 22 and also to the input of the repeated error memory 24. Since the leading edge of the reference signal RS does not occur after the leading edge of the small gate signal SGS, that is, the reference signal RS is outside of the small gate signal SGS, the Q output of the flip-flop 20 remains at the binary 1 level. Following the termination of the small gate signal SGS, that is, after the trailing edge of the small gate signal SGS, a clock signal is applied to a clock input of the repeated error memory 24 and causes the binary 1 output signal from the phase adjust flip-flop 20 to be clocked into and stored in the memory 24. The storage of the binary 1 signal in the memory 24 thereby provides an indication that the reference signal RS has occurred outside of the small gate signal SGS.

If, after the Q output of the phase adjust flip-flop 20 has been set to a binary 1 level, the next reference signal RS also occurs outside of its associated small gate signal SGS, for example, as shown in FIG. 3(b) or FIG. 3(c), the reference signal RS, at a binary 1 level, is applied to the third input of the AND logic gate 22. The associated small gate signal SGS, which is at a binary 0 level during the time of the second reference signal RS (see FIG. 3(b)), is inverted by the inverter 23 to a binary 1 level and applied to the second input of the AND logic gate 22. Since the first input of the AND logic gate 22 is already at a binary 1 level as a result of the Q output of the adjust flip-flop 20 having been previously set to a binary 1 level by the previous small gate signal SGS, the output of the AND logic gate 22 is at a binary 1 level. The binary 1 output signal of the AND logic gate 22 is applied to a reset input of the counters 6, 7, 8 and 9 and causes these counters to be reset thereby resynchronizing the counters to the reference signal RS. In addition, on the next clock signal applied to the repeated error memory 24, the binary 1 output signal of the phase adjust flip-flop 20 is clocked into and stored in the memory 24 thereby to record the fact that the second reference signal RS was also outside of its associated small gate signal SGS.

The memory 24 as discussed hereinabove is arranged in accordance with the present invention to record up to three successive binary 1 signals indicative of three reference signals RS occurring outside of their respective small gate signals SGS. However, to provide a meaningful measure of the extent of phase error conditions, the three binary 1 signals must be stored in the memory 24 within a specified time period. This time period is established by a reset signal which periodically resets the memory 24, for example every three seconds, so that only the binary 1 signals stored in the memory 24 between successive reset operations (within three second periods) are evaluated. If three binary 1 signals are stored in the memory 24 between successive reset operations, a repeat phase error signal is produced by the memory 24. Otherwise, the memory 24 is caused to be reset. The repeat phase error signal may be conveniently used as desired, for example, by external circuitry, to provide an indication of the extent and frequency of phase error conditions. The memory 24 as described hereinabove may be readily implemented by three flip-flop stages.

If, in the above example, the second reference signal RS, rather than occurring outside of its associated small gate signal SGS as assumed above, occurs within its associated small gate signal SGS, the components of the master timing generator 1 assume their states as previously discussed in connection with FIG. 3(a). Accordingly, no indication is stored in the memory 24 for the second reference signal RS and the counters 6, 7, 8 and 9 are not caused to be resynchronized by the AND logic gate 22.

Referring now to FIG. 3(c), there is shown a third possible timing relationship between a reference signal RS and gate signals SGS and LGS as might also occur in a noise environment. In the specific example shown in FIG. 3(c), the reference signal RS occurs outside of both of the gate signals SGS and LGS. This timing situation represents a more serious phase error situation than indicated in FIG. 3(b). In the case of FIG. 3(c), it is desired to detect the fact that the reference signal RS is outside of the small gate signal SGS, so as to record this fact in the memory 24, and, in addition, to detect the fact that the reference signal RS is also outside of the large gate signal LGS, so as to provide an indication, in the form of a phase error signal, should the next reference signal RS also be outside of its associated large gate signal LGS.

The operation of the master timing generator 1 for the specific timing situation shown in FIG. 3(c) is as follows. The small gate signal SGS is applied to the first input of the phase adjust flip-flop 20 and, on its leading edge, causes the flip-flop 20 to be set and to produce a binary 1 output signal at its Q output. This binary 1 output signal is applied to the first input of the AND logic gate 22 and also to the input of the repeated error memory 24. Since the leading edge of the reference signal RS does not occur after the leading edge of the small gate signal SGS, that is, the reference signal RS is outside of the small gate signal SGS, the Q output of the flip-flop 20 remains at the binary 1 level. Following the termination of the small gate signal SGS, a clock signal is applied to the clock input of the memory 24 and causes the binary 1 output signal from the flip-flop 20 to be clocked into and stored in the memory 24. If, after the Q output of the flip-flop 20 has been set to a binary 1 level as discussed above, the next reference signal RS in the next cycle also occurs outside of both of the gate signals SGS and LGS, the reference signal RS, at a binary 1 level, is applied to the third input of the AND logic gate 22. The associated small gate signal SGS, which is at a binary 0 level during the time of the second reference signal RS (see FIG. 3(c)), is inverted by the inverter 23 to a binary 1 level and applied to the second input of the AND logic gate 22. Since the first input of the AND logic gate 22 is already at a binary 1 level as a result of the Q output of the adjust flip-flop 20 having been previously set to a binary 1 level by the previous small gate signal SGS, the output of the AND logic gate 22 is at a binary 1 level and accordingly causes the counters 6, 7, 8 and 9 to be reset thereby resynchronizing the counters to the reference signal RS. In addition, on the next clock signal applied to the repeated error memory 24, the binary 1 output signal of the flip-flop 20 is clocked into and stored in the memory 24 thereby to record the fact that the second reference signal RS was also outside of its associated small gate signal SGS.

In addition to the abovedescribed operations, the fact that the second reference signal RS was outside of its associated large gate signal LGS serves to cause a phase error signal to be produced by an AND logic gate 26. As shown in FIG. 1, a first input of the AND logic gate 26 is coupled to the Q output of the phase adjust flip-flop 20 and second and third inputs of the AND logic gate 26 are coupled to the Q outputs of the flip-flops 15 and 16 via respective inverters 28 and 30. When the second reference signal RS occurs outside of both of the gate signals SGS and LGS, the gate signals SGS and LGS are both at binary 0 levels, and the output Q of the phase adjust flip-flop 20 is at a binary 1 level as a result of having been set by the previous small gate signal SGS. The binary 0 levels of the gate signals SGS and LGS are inverted to binary 1 levels by the inverters 28 and 30, thereby enabling the AND logic gate 26 to produce a binary 1 output signal. This signal may then be used as a large phase error signal to indicate that a serious phase error condition has occurred.

The above discussion relative to FIG. 3(c) assumes that successive reference signals RS have both occurred outside of both of their respective gate signals SGS and LGS as a result of which a large phase error signal is produced by the AND logic gate 26. From the previous discussion, it will also be obvious that a large phase error signal will also be produced by the AND logic gate 26 whenever a first reference signal RS is outside of its associated small gate signal SGS but within its associated large gate signal LGS (e.g., FIG. 3(b)), in which case the phase adjust flip-flop 20 is set to produce a binary 1 signal at its Q output, and is followed by a second reference signal RS which is outside of both of its associated gate signals SGS and LGS. Thus, the AND logic gate 26 will operate to produce a large phase error signal only when the phase adjust flip-flop 20 has been set due to one reference signal RS occurring outside of its associated small gate signal SGS, as in the situations of FIGS. 3(b) and 3(c), and the next reference signal RS is outside of both of its associated gate signals SGS and LGS (FIG. 3(c)).

Figure 4:
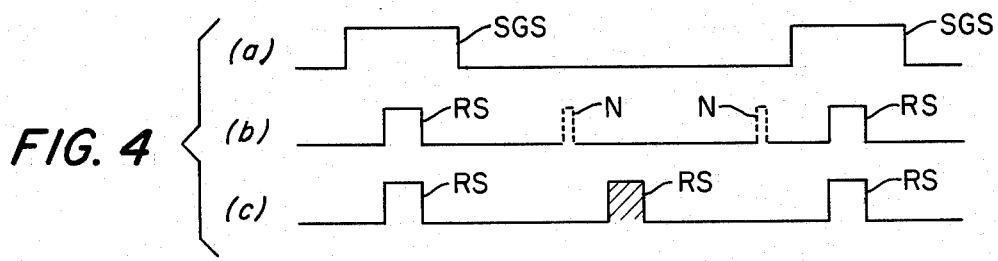
FIGS. 4(a)–4(c) illustrate reference signals of different frequencies which may be employed by the noise-immune master timing generator of the invention.

The master timing generator 1 as described hereinabove may be used with reference signals of different frequencies without requiring any modification of the arrangement or timing of the master timing generator 1 as discussed hereinabove. FIG. 4(a) shows, for example, successive small gate signals SGS within which corresponding reference signals RS of like frequency, and shown in FIG. 4(b), occur. The relationship between the signals of FIGS. 4(a) and 4(b) is that employed by the master timing generator 1 as described hereinabove. However, FIG. 4(c) shows a series of reference signals of different frequency and including individual reference signals RS occurring within corresponding ones of the small gate signals SGS of FIG. 4(a). In the case shown in FIG. 4(c), the reference signal RS occurring outside of the small gate signals SGS, indicated in a cross-hatched fashion in FIG. 4(c), is ignored by the master timing generator 1 as though it never occurred. The same result would occur if noise pulses, such as shown at "N" in FIG. 4(b), were to appear between valid reference signals RS.

Various changes may be made to the master timing generator 1 as described hereinabove. For example, by changing decoder outputs of the master timing generator 1, the durations of the gate signals SGS and LGS may be varied either to increase or decrease the sensitivity of the master timing generator 1. Further, the capacity of the repeated error memory 24 may be altered to increase or decrease the number of signals (binary 1) to be stored therein before a repeat phase error signal will be produced thereby. Other changes and modifications will be apparent to those skilled in the art without departing from the invention as called for in the appended claims.

What is claimed is:

1. A master timing generator comprising:

counting means operable to perform repetitive counting operations and having a reset input by which the counting means may be reset;

first circuit means coupled to the counting means and operative to derive a plurality of gate signals in succession from the counting means, each of said gate signals being of a predetermined first duration;

an input terminal adapted to receive a plurality of reference signals in succession and corresponding to the plurality of gate signals derived by the first circuit means, each of said reference signals being of a second duration less than the first duration of a gate signal derived by the first circuit means; and second circuit means coupled to the input terminal for receiving each reference signal, to the first circuit means for receiving each gate signal, and to the reset input of the counting means, said second circuit means being operative to ascertain the time of occurrence of each reference signal with respect to its corresponding gate signal and if successive ones of the reference signals occur outside of their corresponding gate signals to produce and apply a reset signal to the reset input of the counting means for resetting the counting means.

2. A master timing generator in accordance with claim 1 further comprising:

memory means coupled to the second circuit means and operative to store an indication therein whenever a reference signal occurs outside of its corresponding gate signal.

3. A master timing generator in accordance with claim 2 wherein:

the memory means has a capacity for storing a predetermined number of successive indications therein and is operative if the predetermined number of successive indications have been stored therein within a predetermined period of time to produce a repeat phase error signal.

4. A master timing generator in accordance with claim 1 wherein the second circuit means comprises:

phase adjust means having a first input for receiving each gate signal derived by the first circuit means and a second input coupled to the input terminal for receiving each reference signal, said phase adjust circuit means being operative whenever a reference signal occurs outside of its corresponding gate signal to produce an output signal; and reset means coupled to the phase adjust means for receiving each output signal produced gy the phase adjust means, to the first circuit means for receiving each gate signal derived by the first circuit means, to the input terminal for receiving each reference signal, and to the reset input of the counting means, said reset means being operative if, after the phase adjust means has produced an output signal in response to a reference signal occurring outside of its corresponding gate signal, the next reference signal also occurs outside of its corresponding gate signal, to produce and apply a reset signal to the reset input of the counter means for resetting the counting means.

5. A master timing generator in accordance with claim 4 wherein:

the reference signals, gating signals and the output signals produced by the phase adjust means are of like polarity, each of said reference and gating signals including a first transition from a first level to a second level and a second transition from the second level to the first level and each of said output signals produced by the phase adjust means including a transition from the first level to the second level; and the reset means comprises:

inverter means coupled to the first circuit means and operative to receive and invert the polarity of each gate signal; and logic gate means having a first input coupled to the phase adjust means for receiving each output signal produced by the phase adjust means, a second input coupled to the inverter means for receiving each inverted gate signal produced by the inverter means, a third input coupled to the input terminal for receiving each reference signal, and an output, said logic gate means being operative in response to the signals at its inputs all being at the same level to produce a reset signal at its output.

6. A master timing generator in accordance with claim 5 further comprising:

memory means coupled to the phase adjust means and operative to store each output signal produced by the memory means in response to a reference signal occurring outside of its corresponding gate signal.

7. A master timing generator in accordance with claim 6 wherein:

the memory means has a capacity for storing a predetermined number of successive output signals produced by the phase adjust means and is operative if the predetermined number of successive output signals have been stored therein within a predetermined period of time to produce a repeat phase error signal.

8. A master timing generator in accordance with claim 7 wherein:

the phase adjust means includes a flip-flop circuit; and the logic gate means includes an AND logic gate.

9. A master timing generator in accordance with claim 8 wherein:

the counting means includes a plurality of counters operative to perform repetitive counting operations; and the first circuit means includes;

decoder circuit means coupled to the counters and operative to derive successive sets of timing signals; and flip-flop circuit means coupled to the decoder circuit means and operative in response to each set of timing signals from the decoder circuit means to produce a corresponding gate signal.

10. A master timing generator comprising:

counting means operable to perform repetitive counting operations and having a reset input by which the counting means may be reset;

first circuit means coupled to the counting means and operative to derive in succession a plurality of first gate signals and a plurality of corresponding second gate signals, each of said first gate signals being of a first duration and each of said second gate signals being of a second, greater duration, each of said first gate signals being centered within its corresponding second gate signal;

an input terminal adapted to receive a plurality of reference signals in succession and each corresponding to one of the first gate signals and one of the second gate signals, each of said reference signals being of a third duration less than the first duration of a first gate signal; and second circuit means coupled to the input terminal for receiving each reference signal, to the first circuit means for receiving each first gate signal and each second gate signal, and to the reset input of the counting means, said second circuit means being adapted to ascertain the time of occurrence of each reference signal with respect to its corresponding first and second gate signals, said second circuit means being operative if a reference signal occurs outside of its corresponding first gate signal but within its corresponding second gate signal or if it occurs outside of both gate signals and the next reference signal also occurs outside of its corresponding first gate signal but within its corresponding second gate signal or if it occurs outside of both gate signals, to produce and apply a reset signal to the reset input of the counting means for resetting the counting means, said second circuit means being further operative if a reference signal occurs outside of its corresponding first gate signal but within its corresponding second gate signal or if it occurs outside of both gate signals and the next reference signal occurs outside of its corresponding second gate signal to produce a large phase error output signal.

11. A master timing generator in accordance with claim 10 further comprising:
memory means coupled to the second circuit means and operative to store an indication therein whenever a reference signal occurs outside of its corresponding first gate signal but within its corresponding second gate signal or outside of both gate signals.

12. A master timing generator in accordance with claim 11 wherein:
the memory means has a capacity for storing a predetermined number of successive indications therein and is operative if the predetermined number of successive indications have been stored therein within a predetermined period of time to produce a repeat phase error signal.

13. A master timing generator in accordance with claim 10 wherein the second circuit means comprises:
phase adjust means having a first input for receiving each first gate signal derived by the first circuit means and a second input coupled to the input terminal for receiving each reference signal, said phase adjust circuit means being operative whenever a reference signal occurs outside of its corresponding first gate signal to produce an output signal; and
reset means coupled to the phase adjust means for receiving each output signal produced by the phase adjust means, to the first circuit means for receiving each first gate signal derived by the first circuit means, to the input terminal for receiving each reference signal, and to the reset input of the counting means, said reset means being operative if, after the phase adjust means has produced an output signal in response to a reference signal occurring outside of its corresponding first gate signal, the next reference signal also occurs outside of its corresponding first gate signal, to produce and apply a reset signal to the reset input of the counter means for resetting the counting means.

14. A master timing generator in accordance with claim 13 wherein the second circuit means further comprises:
phase error circuit means coupled to the phase adjust means and to the first circuit means and adapted to receive each output signal produced by the phase adjust means and the first and second gate signals derived by the first circuit means, said phase error circuit means being operative if, after the phase adjust means has produced an output signal in response to a reference signal occurring outside of its corresponding first gate signal, the next reference signal occurs outside of both of its corresponding gate signals to produce a large phase error output signal.

15. A master timing generator in accordance with claim 14 wherein:
the reference signals, the first and second gating signals and the output signals produced by the phase adjust means are of like polarity, each of said reference and gating signals including a first transition from a first level to a second level and a second transition from the second level to the first level and each of said output signals produced by the phase adjust means including a transition from the first level to the second level; and
the phase error circuit means comprises:
first and second inverter means coupled to the first circuit means and operative to receive and invert the polarity of the first and second gating signals, respectively, and;
logic gate means having a first input coupled to the phase adjust means for receiving each output signal produced by the phase adjust means, second and third inputs coupled to the first and second inverter means for respectively receiving the inverted first and second gate signals, and an output, said logic gate means being operative in response to the signals at its inputs all being at the same level to produce a large phase error signal at its output.

16. A master timing generator in accordance with claim 15 wherein:
the reset means comprises:
third inverter means coupled to the first circuit means and operative to receive and invert the polarity of each first gate signal; and
second logic gate means having a first input coupled to the phase adjust means for receiving each output signal produced by the phase adjust means, a second input coupled to the third inverter means for receiving each inverted first gate signal produced by the third inverter means, a third input coupled to the input terminal for receiving each reference signal, and an output, said second logic gate means being operative in response to the signals at its inputs all being at the same level to produce a reset signal at its output.

17. A master timing generator in accordance with claim 16 further comprising:
memory means coupled to the phase adjust means and operative to store each output signal produced by the memory means in response to a reference signal occurring outside of its corresponding first gate signal.

18. A master timing generator in accordance with claim 17 wherein:

the memory means has a capacity for storing a predetermined number of successive output signals produced by the phase adjust means and is operative if the predetermined number of successive output signals have been stored therein within a predetermined period of time to produce a repeat phase error signal.

19. A master timing generator in accordance with claim 18 wherein:

the phase adjust means includes a flip-flop circuit; and
the first and second logic gate means each include an AND logic gate.

20. A master timing generator in accordance with claim 19 wherein:

the counting means includes a plurality of counters operative to perform repetitive counting operations; and the first circuit means includes:
  decoder circuit means coupled to the counters and operative to derive first and second successive sets of timing signals; and
  first and second flip-flop means coupled to the decoder circuit means and operative to receive, respectively, the first and second sets of timing signals, said first flip-flop means being operative in response to each first set of timing signals to produce a corresponding first gate signal and said second flip-flop means being operative in response to each second set of timing signals to produce a corresponding second gate signal.

* * * * *